United States Patent [19]

Coldren

[11] 4,285,763
[45] Aug. 25, 1981

[54] REACTIVE ION ETCHING OF III-V SEMICONDUCTOR COMPOUNDS

[75] Inventor: Larry A. Coldren, Holmdel, N.J.

[73] Assignee: Bell Telephone Laboratories, Incorporated, Murray Hill, N.J.

[21] Appl. No.: 116,541

[22] Filed: Jan. 29, 1980

[51] Int. Cl.$^3$ .................................... H01L 21/306
[52] U.S. Cl. ...................... 156/643; 156/646; 156/662; 204/192 E; 252/79.1
[58] Field of Search ............... 156/643, 646, 662; 252/79.1; 204/192 E

[56] References Cited

U.S. PATENT DOCUMENTS

| | | | |
|---|---|---|---|
| 3,923,568 | 12/1975 | Bersin | 252/79.1 |
| 3,923,569 | 12/1975 | Ono et al. | 252/79.2 |
| 3,951,709 | 4/1976 | Jacob | 252/79.2 |
| 3,971,684 | 7/1976 | Muto | 204/192 E |

OTHER PUBLICATIONS

Todokoro et al. "Selective Etching of GaAs Using a Plasma Process", Matsushita Elec. Co. No. 4A-E-6, pp. 1-3.
Skinner, "New Method . . . Inp Surfaces . . . Formation", Jay Electronic Material, vol. 9, No. 1 (1980), pp. 68-78.
Tsang et al., "Optical . . . Etching", Applied Optics, vol. 14, No. 5, (5/75) pp. 1202-1206.
Weaman et al., "Profile Control . . . Etching", J. of Vac. Science Technology, vol. 15, No. 2 (4/78) pp. 319-326.
Bersin, "A Survey . . . Processes", Solid State Technology (5/76), pp. 31-36.
Flanders et al., "Alignment . . . Grantings" Appl. Physics Letters, vol. 32, No. 10, (5/78), p. 597.
Comerford et al., "Selectively . . . GaAs", Appl. Physics Letters, vol. 25, No. 4, (8/74), pp. 208-210.
Chang, Presentation to American Vacuum Society, Oct. 5, 1979, VU-Graph.

Primary Examiner—Jerome W. Massie
Attorney, Agent, or Firm—Michael B. Einschlag

[57] ABSTRACT

The successful application of the reactive ion etching technique to the III-V compounds requires the use of the appropriate etch gas. We have found that a gas mixture of chlorine ($Cl_2$) and Oxygen ($O_2$) will cleanly and effectively etch heated substrates of GaAs and InP and their ternary and quaternary alloys. The etch rate is increased by heating the substrate to a temperature of 100° to 400° C.

3 Claims, 1 Drawing Figure

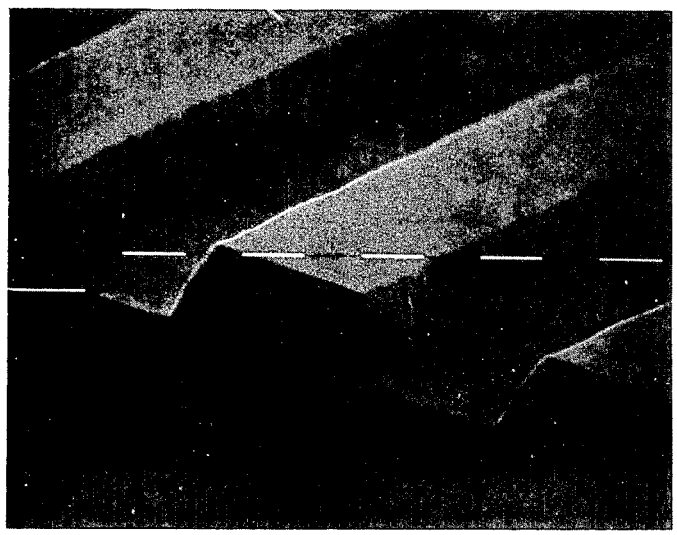

REACTIVE ION ETCHING OF III-V SEMICONDUCTOR COMPOUNDS

BACKGROUND OF THE INVENTION

This invention relates to the processing of semiconductor materials and, more particularly, to a process for reactive ion etching.

III-V semiconductors and their derivative ternary and quaternary compounds are of interest for the fabrication of both high speed switching devices and opto-electronic elements such as lasers and detectors. The necessity for efficient light coupling, confinement and/or transmission puts stringent requirements on the resolution of the pattern transfer technique and on the edge smoothness of the structures formed. Integration of these devices into compact circuits combining high speed electrical and optical processing requires the development of a fabrication technology comparable to that used for silicon integrated circuits.

Preferential chemical etching has been widely used to provide the requisite smooth walls, but patterning III-V compounds in this way requires the precise orientation of the crystalline substrates and thus limits device design possibilities. Gratings selectively etched into GaAs have shown slight sidewall modulation attributed in part to misalignment between the grating direction as defined by the mask, and the cleavage planes, see, for example, an article entitled "Selectively Etched Diffraction Gratings in GaAs", *Applied Physics Letters*, Vol. 25, No. 4, Aug. 15, 1974, pp. 208-210 by K. Comerford and P. Tory. Variation in the depths of preferentially etched channel waveguides according to the initial stripe width in the defining mask has been reported in an article entitled "Optical Waveguides Fabricated by Preferential Etching", *Applied Optics*, Vol. 14, No. 5, May 1975, pp. 1200-1206 by W. T. Tsang, C. C. Tseng, and S. Wang.

Optical gratings have also been produced by ion-beam milling substrates through photoresist masks. Limitations of this technique are possible facetting of the substrate, redeposition of sputtered material (hence alteration of etched profiles) and enhancement of lattice defects, see Tsang et al referred to hereinabove and an article entitled "Profile Control by Reactive Ion Sputter Etching" *J. Vac. Sci. Technol.*, 15 (2), March/April 1978, pp. 319-326 by H. W. Lehmann and R. Widmer.

Reactive ion etching has been used to transfer high resolution sub-micron patterns into Si, $SiO_2$, and $Si_3N_4$ substrates. One example of this is the patterning of square wave gratings 250 Å deep with 3200 Å periodicity into $SiO_2$ see, for example, an article entitled "Alignment of Liquid Crystals Using Semiconductor Periodicity Gratings", *Applied Physics Letters*, Vol. 32, No. 10, May 15, 1978, pp. 597-598 by D. C. Flanders, D. C. Sharer and H. I. Smith. The utility of this technique for the fabrication of component devices for integrated optics is manifest, however, efforts to reactively ion etch III-V compounds have thus far met with limited success, see, for example, an article entitled "A Survey of Plasma-Etching Processes", *Solid State Technology*, 19 (5), May 1976, pp. 31-36, by R. L. Bersin.

SUMMARY OF THE INVENTION

We have developed a process for using reactive ion etching to pattern GaAs, InP and their derivative compounds. Because reactive ion etching is a high resolution pattern-transfer technique it should be of great utility in the fabrication of optical gratings for use in (e.g.) couplers, DFB lasers, Bragg reflectors, waveguides and laser structures.

The successful etching of GaAs and InP also encompasses the range of ternary and quaternary compounds of these materials and thus makes a wide range of integrated optics structures amenable to this technique. Moreover, the anisotropy of the etching obviates constraints placed on the device design by the crystalline substrate orientation.

The successful application of the reactive ion etching technique to the III-V compounds requires the use of an appropriate etch gas. The product compounds of that gas with the substrate material should be sufficiently volatile that they neither impede the etch rate, not reduce the fidelity of the pattern transfer. We have found that a gas mixture of chlorine ($Cl_2$) and Oxygen ($O_2$) will cleanly and effectively etch heated substrates of GaAs and InP.

We have achieved best results when the gas mixture of $Cl_2$ and $O_2$ is maintained at a pressure in the range of 1-10 millitorr, the applied rf power to the cathode electrode upon which the substrate was disposed is in the range of 0.1-1.0 watts/$cm^2$ and the substrate is heated to a temperature in the range of 100°-400° C.

BRIEF DESCRIPTION OF THE DRAWING

A complete understanding of the present invention may be gained from a consideration of the detailed description presented hereinabove in connection with the accompanying drawings in which:

The FIGURE shows a picture of an etched substrate of InP which was etched by a gas mixture of 3.2 millitorr partial pressure of $Cl_2$ and 0.8 millitorr partial pressure of $O_2$ applied to a substrate heated to 250° C.

DETAILED DESCRIPTION

The following describes, in accordance with the present invention, a process for reactive ion etching of GaAs, InP and their derivative ternary and quaternary compounds.

The etch gas used is comprised of chlorine ($Cl_2$) and Oxygen ($O_2$). The gas mixture is maintained in a preferred range of pressure of 1-10 millitorr. The substrate is placed on the cathode of two parallel electrodes and an rf power is applied to the cathode so that the applied rf power density is in the preferred range of 0.1-1.0 watts/$cm^2$ at the cathode area. The substrate is heated to a temperature in the preferred range of 100°-300° C.

We have applied the above-described process to an InP sample in an MRC, Materials Research Corp., Orangeburg, New York, Model No. 8612 (with heated etch platform) sputter deposition-etch station. The InP substrate was photolithographically masked with Ti. The platform was covered with fused silica to help prevent sputtering of platform material onto the substrate.

The FIGURE shows a scanning electron microscope picture of the results obtained when a gas mixture comprising 3.2 millitorr partial pressure of $Cl_2$ and 0.8 millitorr partial pressure of $O_2$. We applied 60 watts of power to the 6 inch diameter cathode and heated the substrate to 250° C. Each horizontal white line corresponds to 1 micron in distance. We achieved a depth of ~2.0 $\mu m$ in about 20 minutes.

The process described can be used over a wide range of parameters. The choice of parameters used to achieve a particular result are derived by using the following guiding principles:

Gas Pressure:
1. When the pressure of the gas is in the high range of 4–10 millitorr the walls of the etched substrate appear faceted and sloped away from the mask material.
2. When the pressure of the gas is in the low pressure range of 1–2 millitorr the walls of the etched substrate tend to be vertical but rougher.

Thus as I increase gas pressure the walls appear to get smoother. It is also important to note that as the power is increased, ion energies increase resulting in more substrate damage and roughness.

Gas Mixture:
1. Pure $Cl_2$ destroys the Ti mask we used and does not appear to etch as well.
2. Addition of $O_2$ raised the etch rate by a factor of 1.5 to 2.0 while preserving the mask. I found that the substrate surface became very rough when the $O_2$ exceeded 30% of the gas mixture. Although a mixture comprising 5–30% of $O_2$ was acceptable, the best results were achieved with a mixture of ~20% $O_2$.
3. Also the addition of 5–30% of Ar to the above mixture has the effect of smoothing the surface in those cases where roughness is a problem.

Substrate Temperature:
1. Addition of heat to the substrate aids the etching process by increasing the volatility of the etch reactants. I have found that the etch rate at 250° C. was about twice the rate at room temperature.
2. The top of the temperature range is in the vicinity of 400° C. because one does not want to anneal contacts (typical annealing temperature for Au-Zn-Au on InP is ~480° C.), diffuse impurities or destroy the stoichiometry of the substrate.

I claim:
1. A process for etching InP, GaAs and their alloys in which a plasma is ignited between two electrodes and the substrates are placed on the cathode electrode to which rf power is applied,
characterized in that
the gas is a mixture of $Cl_2$ and $O_2$ maintained at a pressure of between 1–10 millitorr, and the rf power is applied with a power density of between 0.1–1.0 watts/cm$^2$ of cathode area.

2. A process for etching material comprising InP which comprises the steps of:
igniting a plasma in a gas disposed between a cathode electrode and a second electrode by applying rf power to said cathode electrode and placing said material on said cathode electrode,
characterized in that
the gas is a mixture of $Cl_2$ and $O_2$ maintained at a pressure of between 1–10 millitorr, and the rf power is applied with a power density of between 0.1–1.0 watts/cm$^2$ of cathode area.

3. The process as defined in claim 2 wherein the process is further characterized in that heat is applied to the substrate to raise the temperature of the substrate to between 100° and 400° C.

* * * * *